United States Patent [19]
Lee

[11] Patent Number: 5,329,364
[45] Date of Patent: Jul. 12, 1994

[54] METHOD FOR REDUCING HRC MODE RECEPTION TIME IN CABLE TELEVISION

[75] Inventor: Nam H. Lee, Kyungki-do, Rep. of Korea

[73] Assignee: Samsung Electronics Co., Ltd., Kyonggi-do, Rep. of Korea

[21] Appl. No.: 23,970

[22] Filed: Feb. 26, 1993

[30] Foreign Application Priority Data

Feb. 29, 1992 [KR] Rep. of Korea .................. 92-3378

[51] Int. Cl.⁵ .......................... H04N 7/10; H04N 5/50
[52] U.S. Cl. .................................. 348/11; 455/182.3; 348/731; 348/735
[58] Field of Search .................... 358/86, 191.1, 193.1, 358/195.1; 455/173.1, 182.3, 192.3; H04N 5/50, 7/10

[56] References Cited

U.S. PATENT DOCUMENTS

| | | | |
|---|---|---|---|
| 4,405,947 | 9/1983 | Tults et al. | 358/193.1 |
| 4,763,195 | 8/1988 | Tults | 358/193.1 |
| 4,819,069 | 4/1989 | Tanaka | 358/191.1 |
| 4,823,387 | 4/1989 | Tults | 358/193.1 |
| 4,868,892 | 9/1989 | Tults | 358/193.1 |
| 5,087,977 | 2/1992 | Suizu | 358/193.1 |
| 5,245,437 | 9/1993 | Na | 358/191.1 |

FOREIGN PATENT DOCUMENTS 455046 11/1991 European Pat. Off. .
226722 7/1990 United Kingdom .

Primary Examiner—James J. Groody
Assistant Examiner—Sherrie Hsia

[57] ABSTRACT

The disclosed method for reducing HRC mode reception time of CATV signals is intended for television receivers or video tape recorders provided with a CATV receiver suitable for the North American CATV system but not provided with a CATV mode (STD, HRC and IRC) selection switch. If a channel is selected, corresponding modulation frequency data is transmitted to a tuner. Subsequently, the video signal is checked for the presence of synchronizing signals, and this information is used to determine whether the broadcast is in STD mode or in HRC mode, prior to broadcast signal reception. This eliminates waiting time, reducing HRC mode reception time to only about 100 ms (the time needed to check for the presence of the synchronizing signals), and prevents noises from being generated as well as improving reception quality.

12 Claims, 3 Drawing Sheets

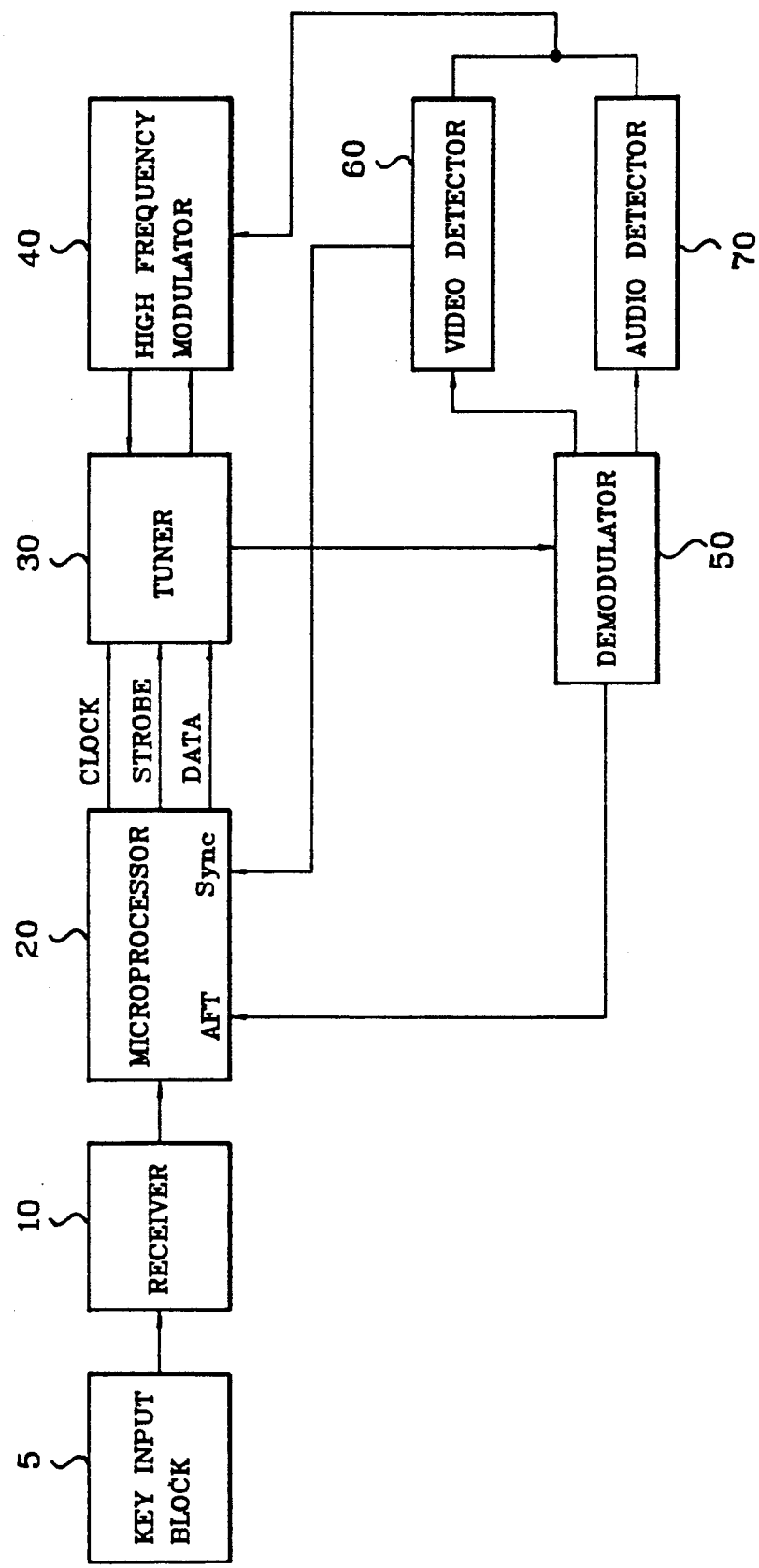

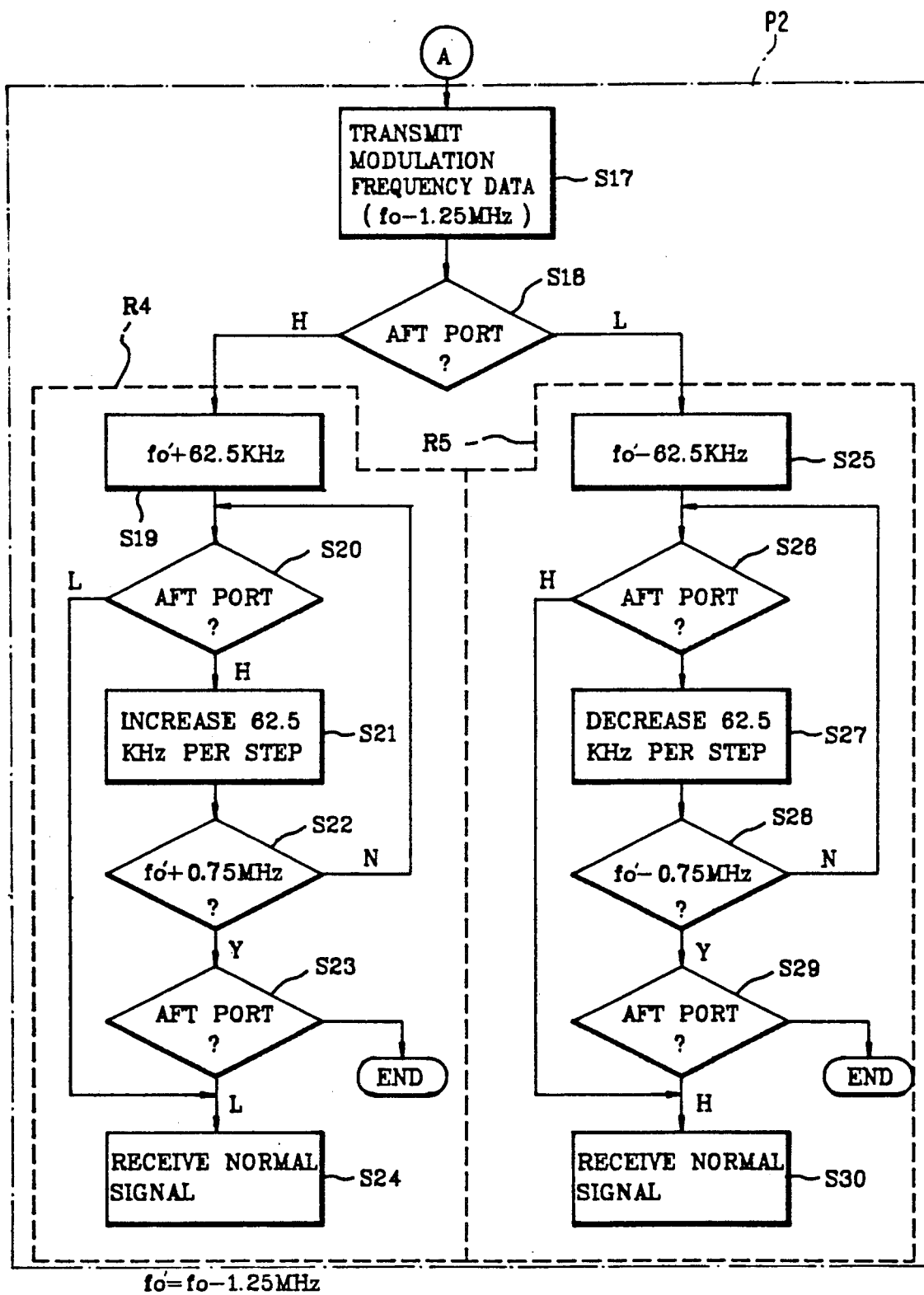

METHOD FOR REDUCING HRC MODE RECEPTION TIME IN CABLE TELEVISION

The following disclosure is based on Korean Patent Application No. 92-3378 filed on Feb. 29, 1992, which is incorporated into this application by reference.

BACKGROUND OF THE INVENTION

1. Field of the Invention

The present invention relates to television receivers or video cassette tape recorders (hereinafter called "VCR") containing a receiver for cable television (hereinafter called "CATV") signals, and more particularly to a method for reducing the reception time of a Harmonical Related Carriers (hereinafter called "HRC") mode of a CATV signal. According to the invention, HRC mode reception time can be reduced by performing Auto Fine Tuning (hereinafter called "AFT") in cases where the television receiver or VCR does not have a mode selection switch suitable for the North American CATV system.

In the HRC mode, picture carrier frequencies of all channels except channels 5 and 6 are lower by 1.25 MHz than those frequencies in standard (hereinafter called "STD") mode. The picture carrier frequencies of channel 5 and 6 are higher by 0.75 MHz than those frequencies in the STD mode. Therefore, supposing that a modulation frequency in the STD mode is fo, the corresponding frequency in the HRC mode will be fo' (=fo−1.25 MHz) (hereinafter called "fo'").

2. Description of the Related Art

U.S. Pat. No. 4,823,387 describes an improvement of tuning capabilities for scrambled channels, more particularly for tuning non-standard radio frequency (RF) signals containing scrambled video data using AFT.

Such improvements permit reception of channels being broadcast in HRC mode even by a TV receiver or VCR without a CATV mode (STD, HRC, IRC (Interval Related Carriers)) selection switch, as long as the TV receiver or VCR is provided with a CATV receiver, by performing AFT operation.

However, the AFT operation takes approximately 500-900 ms at least, and a noise is generated due to a delay time at the beginning of reception. This results in problems of poor quality for TV receivers or VCRs without CATV mode (including STD, HRC, IRC) selection switches. In cases where the TV receiver or VCR is provided with a CATV mode selection switch, the problem does not exist, but the manufacturing cost of the unit is increased.

SUMMARY OF THE INVENTION

The present invention solves the problems inherent in U.S. Pat. No. 4,823,387. An object of the present invention is to provide a method for reducing HRC mode reception time in CATV so that the initial delay time is eliminated, thus resulting in the prevention of noises and in the improvement in quality of a TV receiver or a VCR without a CATV mode selection switch. This can be achieved by reducing HRC mode reception time to less than 100 ms (i.e., by 400–800 ms) by performing AFT search operations after determining the presence of broadcasting signals upon detection of synchronizing signals.

In order to achieve the object, the present invention is characterized by a method for reducing HRC mode reception time of CATV signals. The method includes an initial step for transmitting a corresponding modulation frequency (fo) to a tuner and determining the presence of a video synchronizing signal using a system control microprocessor whenever a channel has been selected through a remote control or key pad. Next, in a normal signal reception step, executed when synchronizing signals are detected by the initial step and the output of an AFT port is high, the AFT port is monitored while the modulation frequency (fo) is increased in steps of 62.5 KHz until the increased portion reaches +2 MHz. However, as soon as the state of the AFT port changes to low, the step-wise increase of modulation frequency is stopped, in order to receive normal signals, since the change of state of the AFT port is interpreted as an indication that the precise tuning point for the STD mode has been reached. Alternatively, in a normal signal reception step executed when synchronizing signals are detected by the initial step but the output of the AFT port is low, the AFT port is monitored while the modulation frequency fo is decreased in steps of 62.5 KHz until the decreased portion reaches −0.5 MHz. However, as soon as the state of the AFT port changes to high, the step-wise decrease of modulation frequency is stopped, in order to receive normal signals, since the change of state of the AFT port is interpreted as an indication that the precise tuning point for the STD mode has been reached.

As a further alternative, in a normal signal reception step, executed when synchronizing signals are not detected by the initial step, a modulation frequency (fo'=-fo−1.25 MHz) is transmitted, and the AFT port is again monitored. If the state of the AFT port is high, the modulation frequency fo' is increased in steps of 62.5 KHz until the increased portion reaches +0.75 MHz or until the state of the AFT port changes to low. As soon as the state of the AFT port changes to low, the step-wise increase of modulation frequency is stopped, in order to receive normal signals, since the change of state of the AFT port is interpreted as an indication that the precise tuning point for HRC mode has been reached. As a last alternative, in a normal signal reception step, executed when synchronizing signals are not detected by the initial step, a modulation frequency (fo'=fo−1.25 MHz) is again transmitted, and the AFT port is again monitored. This time, if the state of the AFT port is low, the modulation frequency fo' is decreased in steps of 62.5 KHz until the decreased portion reaches −0.75 MHz or until the state of the AFT port changes to high. As soon as the state of the AFT port changes to high, the step-wise decrease of modulation frequency is stopped, in order to receive normal signals, since the change of state of the AFT port is interpreted as an indication that the precise tuning port for HRC mode has been reached.

BRIEF DESCRIPTION OF THE DRAWINGS

FIG. 1 is a schematic block diagram showing the construction of a CATV receiver in accordance with the present invention.

FIGS. 2A and 2B are flow charts showing the operational principle of the method for reducing the HRC mode reception time in CATV, according to the present invention.

DETAILED DESCRIPTION OF PREFERRED EMBODIMENTS OF THE INVENTION

Figure 2A:
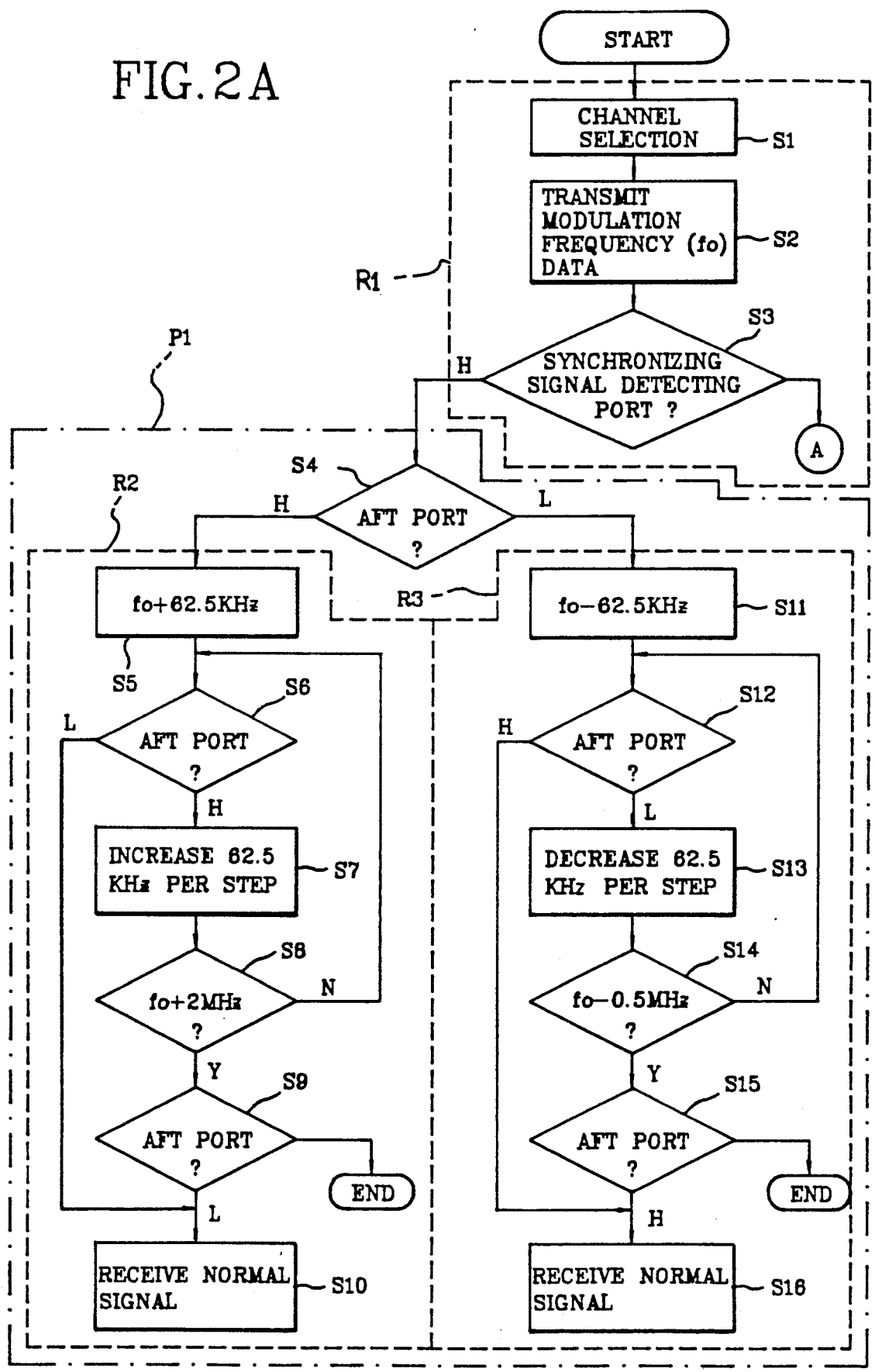

A preferred embodiment of the present invention is described in detail hereunder with reference to the attached drawings.

FIG. 1 is a block diagram of a CATV receiver showing a desired implementation of the present invention. The receiver includes a key input block 5 consisting of a remote controller or a key panel, a receiver 10 for receiving the output signals from the key input block 5, a microprocessor 20 connected to the receiver 10 for controlling the whole system, a tuner 30 connected to the microprocessor 20 for performing tuning operations according to a clock signal and data from the microprocessor 20. In addition, the receiver includes a high frequency modulator 40 connected to the tuner 30 for high frequency modulating the tuned signal, a demodulator 50 connected to the tuner 30 for demodulating the tuned signal by intermediate frequency processing and for feeding an AFT signal detected by an AFT detector (not shown in the drawing) back to the microprocessor 20, a video detector 60 connected to the demodulator 50, for sending a detecting signal to the microprocessor 20 when a video signal is detected from the demodulated signal, and an audio detector 70 connected to the demodulator 50, for detecting audio signals from the demodulated signals.

FIGS. 2A and 2B are flow charts showing the operation of the CATV receiver according to the present invention. FIG. 2A relates to STD mode reception and FIG. 2B to HRC mode reception. More specifically, a preferred implementation of the present invention consists of an initial routine R1, a STD mode reception routine P1, and an HRC mode reception routine P2.

The initial routine R1 in FIG. 2A comprises a selecting step S1 for selecting a channel through the key input block 5, a transmitting step S2 for transmitting modulation frequency (fo) data to a PLL (Phase Locked Loop) IC (for selecting channels, not shown in the drawing) of the tuner 30 when a channel has been selected, and a determining step S3 for determining the presence of a synchronizing signal by checking the video signal demodulated by the demodulator 50.

The STD mode reception step P1 is executed whenever it is determined that a STD mode signal is being broadcast, i.e. that there exists a video signal within +2 MHz and −0.5 MHz of the modulation frequency fo. This determination is based upon the detection of a high state of the synchronizing detection port (indicating that a synchronizing signal is detected) in the determining step S3. A routine R2 is executed if the AFT port is determined to be high; and a routine R3 is executed if the AFT port is determined to be low.

The routine R2 includes an increasing step S5 for increasing the modulation frequency (fo) by a step of 62.5 KHz when the AFT port is determined to be high in the determining step S4. This is followed by a determining step S6 for checking the state of the AFT port after the increase of the modulation frequency (fo) in the increasing step S5. A further increasing step S7 either stops the increase of modulation frequency (fo) if the state of the AFT port is changed to low or resumes the increase of modulation frequency (fo) if the state of the AFT port is changed again to high. A determining step S8 follows, which determines whether the increased portion of the modulation frequency (fo) has reached 2 MHz. If the increased portion has not reached 2 MHz, the determining step S8 returns processing to the determining step S6 to check the AFT port. If the increased portion has reached 2 MHz, the AFT port is checked directly in the determining step S9 without returning to the determining step S6. Finally, a reception step S10 terminates the AFT operation after the modulation frequency is transmitted if the state of the AFT port remains high, or triggers reception of normal signals if the AFT port changes its state to low, in the above described order.

The routine R3, executed if the AFT is determined to be low in step S4, includes a decreasing step S11 for decreasing the modulation frequency (fo) by a step of 62.5 KHz when the AFT port is determined to be low in the determining step S4. This is followed by a determining step S12 for checking the AFT port after the decrease of modulation frequency in the decreasing step S11. Processing then either causes the reception of normal signals to begin after the decrease of modulation frequency is stopped if the AFT port is changed to high, or further decreases the modulation frequency by a step of 62.5 KHz in step S13 if the AFT port remains low. A determining step S14 follows, which determines whether the decreased portion of the modulation frequency has reached −0.5 MHz. If the decreased portion has not reached −0.5 MHz, the determining step S14 returns processing to the determining step S12 to check the AFT port. If the increased portion has reached −0.5 MHz, the AFT port is checked directly in the determining step S15 without returning to the determining step S12. Finally, a reception step S16 terminates the AFT operation after the modulation frequency is transmitted if the state of the AFT port remains low, or commences reception of normal signals if the AFT port changes its state to high, in the above described order.

The HRC mode reception step P2 in FIG. 2B is executed when no synchronizing signal is detected at the determining step S3. The P2 processing includes a transmitting step S17 for transmitting a modulation frequency (fo′=fo−1.25 MHz). It further includes a determining step S18 for checking the state of the AFT port. A routine R4 is executed if the AFT port is determined to be high; and a routine R5 is executed if the AFT port is determined to be low.

The routine R4 comprises an increasing step S19 for increasing the modulation frequency (fo′) by a step of 62.5 KHz when the AFT port is determined to be high in the determining step S18. This is followed by a determining step S20 for checking the state of the AFT port after the increase of the modulation frequency (fo′) in the increasing step S19. A further increasing step S21 either stops the increase of the modulation frequency and begins normal signal reception if the state of the AFT port is changed to low, or increases the modulation frequency again if the state of the AFT port remains high. A determining step S22 follows, which determines whether the increased portion of the modulation frequency (fo′) has reached 0.75 MHz. If the increased portion has not reached 0.75 MHz, the determining step S22 returns processing to the determining step S20 to check the AFT port. If the increased portion has reached 0.75 MHz, the AFT port is checked directly in the determining step S23 without returning to the determining step S20. Finally, a reception step S24 terminates the AFT operation after the modulation frequency is transmitted if the state of the AFT port remains high, interpreting the high state as absence of broadcast signal. Alternatively, reception of normal signals begins if the AFT port changes its state to low.

The routine R5, executed if the AFT is determined to be low in step S5, includes a decreasing step S25 for decreasing the modulation frequency (fo') by a step of 62.5 KHz when the AFT port is determined to be low in the determining step S18. This is followed by a determining step S26 for checking the AFT port after the decrease of the modulation frequency in the decreasing step S25. Processing then either causes the reception of normal signals to begin after the decrease of modulation frequency ceases if the AFT port is changed to high, or further decreases the modulation frequency by a step of 62.5 KHz in step S27 if the AFT port remains low. A determining step S28 follows, which determines whether the decreased portion of the modulation frequency has reached −0.75 MHz. If the decreased portion has not reached −0.75 MHz, the determining step S28 returns processing to the determining step S26 to check the AFT port. If the increased portion has reached −0.75 MHz, the AFT port is checked directly in the determining step S29 without returning to the determining step S26. Finally, a reception step S30 terminates the AFT operation after the modulation frequency is transmitted if the state of the AFT port remains low, or triggers the reception of normal signals if the AFT port changes its state to high, in the above described order.

Operation of the present invention as described above will be described hereunder, referring to the modulation frequency of the STD mode as fo and that of the HRC mode as fo' (=fo−1.25 MHz). The selection step S1 is performed first, to select channels by means of the key input block 5, and in step S2, modulation frequency (fo) data of the selected channel is output to the PLL IC (for channel selection) of the tuner 30.

Further, in step S3, the presence of a video synchronizing signal is determined after the video detector 60 detects video signals demodulated by the demodulator 50. The presence of the video synchronizing signal can be determined by checking the output of the synchronizing detection port of the video block inside the TV receiver of VCR. If the output is high, it can be assumed that STD mode signals are being broadcast since there must be video signals within −0.5 MHz and +2 MHz of the modulation frequency (fo). This is made possible by suitably designing the intermediate frequency characteristic of the tuner 30. Therefore, if the synchronizing detection port is high, determining step S4 is performed to check the AFT port. If the AFT port is high, the modulation frequency is increased by a step of 62.5 KHz in step S5, and this checking and increasing is repeated until the increased portion reaches 2 MHz. More specifically, if the AFT port is determined to be high in the determining step S4, increasing step S5 is performed to increase the modulation frequency (fo) by a step of 62.5 KHz (fo+62.5 KHz), and determining step S6 is performed to check the AFT port. As soon as the AFT port changes its state from high to low, the modulation frequency at the time is considered to be the precise tuning frequency, and the increase in modulation frequency is stopped and normal signals are received. However, if the AFT port remains high, increasing step S7 is performed to increase the modulation frequency by a step and determining step S8 determines whether the increased portion has reached 2 MHz, i.e., whether the modulation frequency has reached fo+2 MHz.

If the increased portion is less than 2 MHz, the increasing step S6 is performed again to increase the modulation frequency by a step, and this is repeated until the AFT port changes its state to low. However, if the increased portion is equal to 2 MHz in the determining step S8, determining step S9 is performed to check the AFT port.

If the AFT port is still high, it is considered that there are no broadcasting signals, and the AFT operation is terminated while transmitting the modulation frequency (fo). If the AFT port changes its state to low, it is considered to be the precise tuning point and the reception step S10 is performed to step increasing the modulation frequency and begin reception of normal signals.

Further, if the synchronizing detection port is high in the determining step S3 and if the AFT port is low in the determining step S4, the modulation frequency is decreased by a step of 62.5 KHz until the decreased portion reaches −0.5 MHz, while checking the AFT port after every such decrease.

More specifically, if the AFT port is low in determining step S4, a decreasing step S11 is performed to decrease the modulation frequency by a step of 62.5 KHz and then determining step S12 is performed to check the AFT port again. If in determining step S12 the AFT port has changed to high, it is considered to be the precise tuning frequency and the reception step S16 is performed to stop decreasing the modulation frequency and begin reception of normal signals. If the AFT port is still low, decreasing step S13 is performed again to decrease the modulation frequency by a step of 62.5 KHz and the determining step S14 determines whether the decreased portion is equal to −0.5 MHz.

If the decreased portion is less than −0.5 MHz, the determining step S12 and the decreasing step S13 are performed again to decrease the modulation frequency by a step, and this is repeated until the AFT port changes its state to high. Further, if the decreased portion is equal to −0.5 MHz in the determining step S14, determining step S15 is performed to check the AFT port.

If in the determining step S15 the AFT port is still low, it is assumed that there are no broadcasting signals, and the AFT operation is terminated while transmitting the modulation frequency (fo). If the AFT port changes its state to high, it is considered to be the precise tuning point and the reception step S16 is performed to stop decreasing the modulation frequency and begin reception of normal signals.

Meanwhile, if no synchronizing signal is detected in the determining step S3, it is assumed that the selected channel is not being broadcast in the STD mode but in the HRC mode, and the transmitting step S17 is performed to transmit the modulation frequency (fo'=-fo−1.25 MHz) data for the HRC mode. After this, the AFT port is checked, and if its state is high, the modulation frequency is increased by a step of 62.5 KHz until the increased portion reaches +0.75 MHz, while checking the AFT port after every such increase.

More specifically, if the AFT port is determined to be high in the determining step S18 the modulation frequency (fo') is increased by a step (fo'+62.5 KHz) and the AFT port is again checked in the determining step S20. If the AFT port changes its state to low, it is considered to be the precise tuning frequency and the reception step S24 is performed to stop increasing the modulation frequency and begin reception of normal signals. If the AFT port is still high, increasing step S21 is performed to increase the modulation frequency (fo') by a step and the determining step S22 determines whether the increased portion has reached 0.75 MHz, i.e., whether the modulation frequency (fo') has reached fo'+0.75 MHz. If the increased portion is less than 0.75 MHz, the increasing step S20 is performed again to increase the modulation frequency (fo') by a step, and this is repeated until the AFT port changes its state to low. However, if the increased portion is equal to 0.75 MHz in the determining step S22, making the modulation frequency fo'+0.75 MHz, determining step S23 is performed to check the AFT port.

If in determining step S23 the AFT port is still high, it is assumed that there are no broadcasting signals, and the AFT operation is terminated while transmitting the modulation frequency (fo'). If the AFT port changes its state to low, it is considered to be the precise tuning point and the reception step S24 is performed to stop increasing the modulation frequency and begin reception of normal signals.

Meanwhile, if the AFT port is determined to be low in the determining step S18, the decreasing step S25 is performed again to decrease the modulation frequency (fo') by a step, and the determining step S26 is performed to check the AFT port. If the AFT port changes its state to high, it is considered as the precise tuning point and the reception step S30 is performed to stop increasing the modulation frequency and begin reception of normal signals. If the AFT port is still low, decreasing step S27 is performed to decrease the modulation frequency (fo') by a step and the determining step S28 determines whether the decreased portion has reached −0.75 MHz, i.e., whether the modulation frequency (fo') has reached fo'−0.75 MHz.

If the decreased portion is less than 0.75 MHz, the decreasing step S26 is performed again to decrease the modulation frequency (fo') by a step, until the AFT port changes its state to high. However, if the decreased portion is equal to −0.75 MHz in the determining step S28, making the modulation frequency fo'−0.75 MHz, determining step S29 is performed to check the AFT port.

If in determining step S29 the AFT port is still low, it is assumed that there are no broadcasting signals, and the AFT operation is terminated while transmitting the modulation frequency (fo'). If the AFT port changes it state to high, it is considered to be the precise tuning frequency and the reception step S30 is performed to stop decreasing the modulation frequency and begin reception of normal signals.

As described above, the present invention has the effect of improving the quality of the TV receiver or VCR that is not equipped with a CATV mode (STD, HRC, and IRC) selection switch. Specifically, the invention prevents noises from being generated by reducing the HRC mode reception time. Thus, when a channel is selected, the corresponding modulation frequency is transmitted and the presence of a synchronizing signal is used to determine whether the broadcasting signals are in STD mode or HRC mode in advance of normal signal reception. This eliminates the waiting time and reduces the HRC mode reception time to as low as about 100 ms, the time needed to determine the presence of the synchronizing signal.

What is claimed is:

1. In a video signal receiver without a CATV mode selection switch, a method for reducing HRC mode reception time comprising:
   an initial step comprising transmitting to a tuner a modulation frequency corresponding to a selected channel and determining the presence of a video synchronizing signal using a system control microprocessor when a channel has been selected;
   a first normal signal reception step, executed when the synchronizing signal is detected in said initial step and an output state of an AFT port is high, comprising monitoring the AFT port while stepwise increasing the modulation frequency either until an increased portion reaches a given limit, or until the output state of the AFT port changes to low, and, as soon as the output state of the AFT port changes to low, stopping the stepwise increase of modulation frequency and commencing reception of normal signals broadcast in standard mode;
   a second normal signal reception step, executed when the synchronizing signal is detected in said initial step and the output state of the AFT port is low, comprising monitoring the AFT port while stepwise decreasing the modulation frequency either until a decreased portion reaches a given limit, or until the output state of the AFT port changes to high, and, as soon as the output state of the AFT port changes to high, stopping the stepwise decrease of modulation frequency and commencing reception of normal signals broadcast in standard mode;
   a third normal signal reception step, executed when the synchronizing signal is not detected in said initial step and the output state of the AFT port is high, comprising transmitting an adjusted modulation frequency, monitoring the AFT port while stepwise increasing the adjusted modulation frequency either until the increased portion reaches a given limit or until the output state of the AFT port changes to low, and, as soon as the output state of the AFT port changes to low, stopping the stepwise increase of the adjusted modulation frequency and commencing reception of normal signals broadcast in HRC mode; and
   a fourth normal signal reception step, executed when the synchronizing signal is not detected in said initial step, and the output state of the AFT port is low, comprising transmitting the adjusted modulation frequency, monitoring the AFT port while stepwise decreasing the adjusted modulation frequency either until the decreased portion reaches a given limit or until the output state of the AFT port changes to high, and, as soon as the output state of the AFT port changes to high, stopping the stepwise decrease of the adjusted modulation frequency and commencing reception of normal signals broadcast in HRC mode.

2. A method according to claim 1, wherein
   the stepwise increase in the modulation frequency in said first normal signal reception step is performed such that each step increases the modulation frequency by 62.5 KHz.

3. A method according to claim 1, wherein
   the given limit in said first normal signal reception step corresponds to an increase in the modulation frequency of 2 MHz.

4. A method according to claim 1, wherein the stepwise decrease in the modulation frequency in said second normal signal reception step is performed such that each step decreases the modulation frequency by 62.5 KHz.

5. A method according to claim 1, wherein the given limit in said second normal signal reception step corresponds to a decrease in the modulation frequency of 0.5 MHz.

6. A method according to claim 1, wherein the adjusted modulation frequency of said third normal signal reception step is obtained by decreasing the modulation frequency of said initial step by 1.25 MHz.

7. A method according to claim 1, wherein the stepwise increase in the adjusted modulation frequency in said third normal signal reception step is performed such that each step increases the adjusted modulation frequency by 62.5 KHz.

8. A method according to claim 1, wherein the given limit in said third normal signal reception step corresponds to an increase in the adjusted modulation frequency of 0.75 MHz.

9. A method according to claim 1, wherein the adjusted modulation frequency of said fourth normal signal reception step is obtained by decreasing the modulation frequency of said initial step by 1.25 MHz.

10. A method according to claim 1, wherein the stepwise decrease in the adjusted modulation frequency in said fourth normal signal reception step is performed such that each step decreases the adjusted modulation frequency by 62.5 KHz.

11. A method according to claim 1, wherein the given limit in said fourth normal signal reception step corresponds to a decrease in the adjusted modulation frequency of 0.75 MHz.

12. A method for operating a video signal receiver, comprising the steps of:
  receiving a video channel selection;
  obtaining modulation frequency data from the video channel selection;
  determining the presence of a synchronizing signal in a video signal corresponding to the video channel selection;
  performing a logic operation to choose between executing a standard mode reception routine and executing a harmonical related carrier mode reception routine, wherein the choice between the routines is determined by the presence of the synchronizing signal; and
  executing either the standard mode reception routine or the harmonical related carrier mode reception routine in accordance with the determination in said logic operation performing step; wherein
  the standard mode reception routine includes changing the modulation frequency in stepwise fashion, monitoring an output state of an AFT port after each step, and commencing reception of standard mode broadcast signals once the output state of the AFT port changes; and
  the harmonical related carrier mode reception routine includes adjusting the modulation frequency to form an adjusted modulation frequency, changing the adjusted modulation frequency in stepwise fashion, monitoring an output state of an AFT port after each step, and commencing reception of HRC mode broadcast signals once the output state of the AFT port changes.

* * * * *